United States Patent
Liang et al.

(10) Patent No.: US 6,326,283 B1
(45) Date of Patent: Dec. 4, 2001

(54) TRENCH-DIFFUSION CORNER ROUNDING IN A SHALLOW-TRENCH (STI) PROCESS

(75) Inventors: Victor Liang, Milpitas; Olivier Laparra; Mark Rubin, both of San Jose, all of CA (US)

(73) Assignee: VLSI Technology, Inc., San Jose, CA (US)

(*) Notice: Subject to any disclaimer, the term of this patent is extended or adjusted under 35 U.S.C. 154(b) by 0 days.

(21) Appl. No.: 09/519,908

(22) Filed: Mar. 7, 2000

(51) Int. Cl.[7] .................................................. H01L 21/76
(52) U.S. Cl. .......................... 438/424; 257/510; 438/218; 438/296; 438/435
(58) Field of Search .................................. 257/374, 510; 438/218, 296, 424, 435, 437

(56) References Cited

U.S. PATENT DOCUMENTS

| | | | |
|---|---|---|---|
| 5,719,085 | * | 2/1998 | Moon et al. ........................... 438/424 |
| 5,801,083 | * | 9/1998 | Yu et al. .............................. 438/424 |
| 5,937,309 | * | 8/1999 | Chuang ................................ 438/424 |
| 6,060,399 | * | 5/2000 | Kim et al. ............................ 438/706 |
| 6,091,129 | * | 7/2000 | Cleeves ............................... 257/510 |
| 6,150,234 | * | 11/2000 | Olsen ................................. 438/424 |
| 6,174,786 | * | 1/2001 | Kelley et al. ........................ 438/425 |
| 6,180,466 | * | 1/2001 | Ibok .................................. 438/296 |

OTHER PUBLICATIONS

Chatterjee et al., A shallow trench isolation using LOCOS edge for preventing corner effects for 0.25/0.18 µm CMOS technologies and beyond, International Electronic Devices Meeting, 1996, 829–832.*

P. Sallagoity, et al. "Analysis of Width Edge Effects in Advanced Isolation Schemes for Deep Submicron CMOS Technologies", IEEE Trans. Elect. Devices. vol. 43, No. 11, Nov. 1996.

\* cited by examiner

*Primary Examiner*—Richard Elms
*Assistant Examiner*—Christian D. Wilson

(57) ABSTRACT

An isolation structure on an integrated circuit is formed using a shallow trench isolation process. A layer of buffer oxide is formed on a substrate. A layer of nitride is formed on the layer of buffer oxide. The layer of nitride and the layer of buffer oxide are patterned to form a trench area. An oxidation of the substrate is performed to provide for round corners at a perimeter of the trench area. The substrate is then etched to form a trench within the trench area.

6 Claims, 6 Drawing Sheets

TRENCH-DIFFUSION CORNER ROUNDING IN A SHALLOW-TRENCH (STI) PROCESS

BACKGROUND

The present invention concerns the fabrication of integrated circuits and pertains particularly to trench-diffusion corner rounding in a shallow-trench (STI) process.

In fabricating integrated circuits, various processes are used to form field oxide. For example, a local oxidation of silicon (LOCOS) process is often used to form field oxide regions. In a LOCOS process, a layer of pad oxide is formed. On top of the pad oxide, a layer of nitride is formed. The nitride is patterned and etched. Field oxide is grown on the substrate at places where the nitride has been etched to expose the substrate. The nitride and pad oxide are then removed.

Shallow trench isolation (STI) is gradually replacing conventional LOCOS process for the formation of an isolation structure as technology is evolving to submicron geometry. STI has various advantages over the conventional LOCOS process. For example, STI allows for the planarization of the isolation structure. This results in better control of critical dimension (CD) when defining a gate stack of a transistor. Better control of CD when defining the gate stack results in better control of CD in further processing steps which occur after the gate stack is defined.

In a typical STI process, a buffer oxide of 10 to 20nm is thermally grown on wafer substrate. A nitride of approximately 200nm is deposited and then patterned with lithography and etched down to silicon. An etch that is selective to silicon (etches mostly silicon) is then used to etch a trench into the silicon. A liner oxide is thermally grown to anneal out any damage to the silicon and passivate the silicon. Next, an oxide that is considerably thicker than the trench depth is deposited. The wafer is then subjected to a chemical-mechanical (CMP) polishing that stops when it reaches the nitride. The nitride is then stripped, along with the buffer oxide underneath, thereby forming the shallow trench isolation.

For the above-described STI processing scheme, the sharp corner where the trench side wall meets the silicon surface causes many problems with device performance, yield, and reliability. See, for example, P. Sallagoity, et al."Analysis of Width Edge Effects in Advanced Isolation Schemes for Deep Submicron CMOS Technologies", IEEE Trans. Elect. Devices. Vol. 43, No. 11, November 1996. The problems include a parasitic transistor at the corner that has a lower threshold voltage, and thinner gate oxide at the corner, resulting in immediate device failure or reliability issues.

SUMMARY OF THE INVENTION

In accordance with the preferred embodiment of the present invention, an isolation structure on an integrated circuit is formed using a shallow trench isolation process. A layer of buffer oxide is formed on a substrate. A layer of nitride is formed on the layer of buffer oxide. The layer of nitride and the layer of buffer oxide are patterned to form a trench area. An oxidation of the substrate is performed to provide for round corners at a perimeter of the trench area. The substrate is then etched to form a trench within the trench area.

In the preferred embodiment processing continues by growing a layer of liner oxide within the trench. The trench is filled with oxide. A chemical-mechanical polish of the oxide is performed down to the nitride layer. The nitride layer is then removed.

The rounded corners at the perimeter of the trench increases the threshold voltage of the parasitic transistor at the corners of the trench. The rounded corners also allow for oxide at the corners to be thick enough to overcome immediate device failure and reliability issues.

DESCRIPTION OF THE PREFERRED EMBODIMENT

Figure 1:
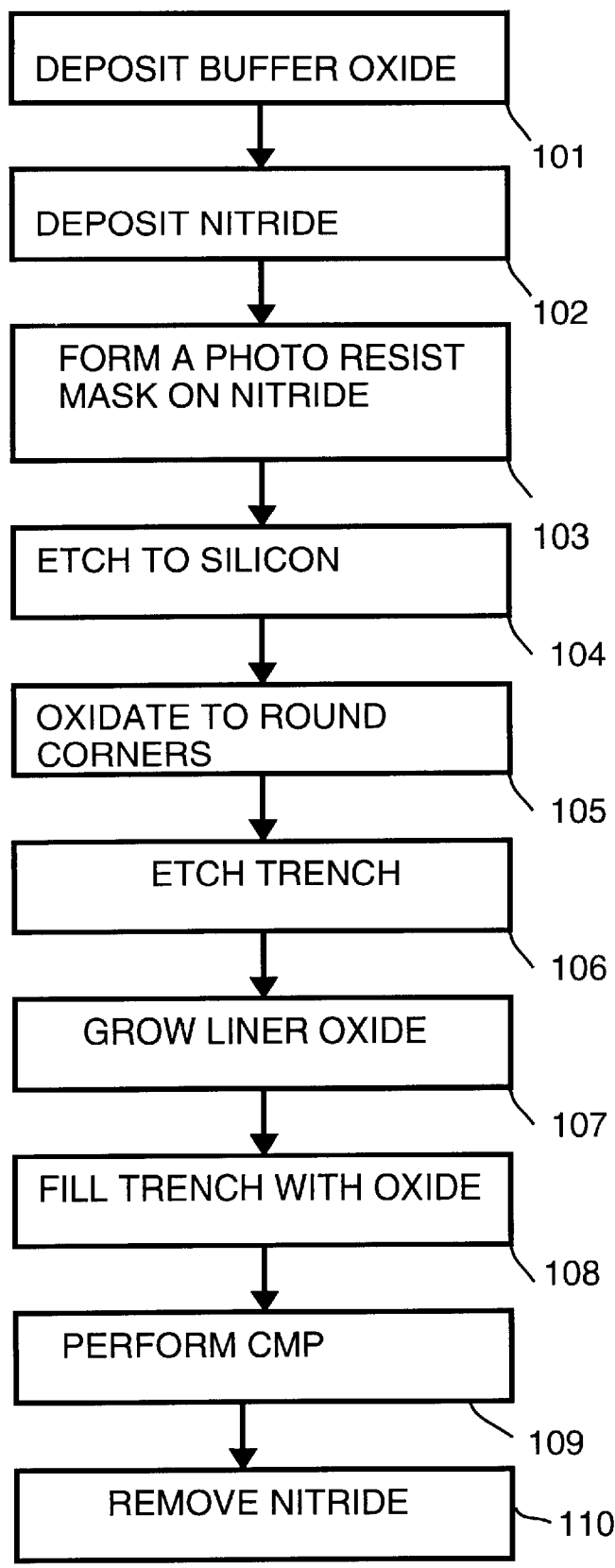
FIG. 1 is a flowchart for a shallow trench isolation process in accordance with a preferred embodiment of the present invention.
Figure 2:
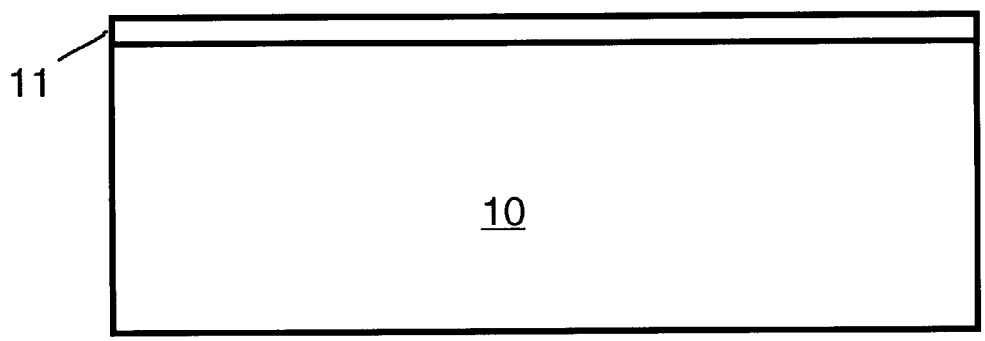
FIGS. 2, 3, 4, 5, 6, 7, 8, 9 and 10 illustrate the shallow trench isolation process described in FIG. 1 in accordance with a preferred embodiment of the present invention.

FIG. 1 is a flowchart for a shallow trench isolation process in accordance with a preferred embodiment of the present invention. In a step 101, illustrated by FIG. 2, a layer of buffer (pad) oxide 11 is formed on a substrate 10 of a semiconductor wafer. For example, layer of buffer oxide 11 is formed by thermal oxidation of silicon to grow the oxide. The layer of buffer oxide is, for example, 10 to 20 nanometers (nm) thick.

Figure 3:
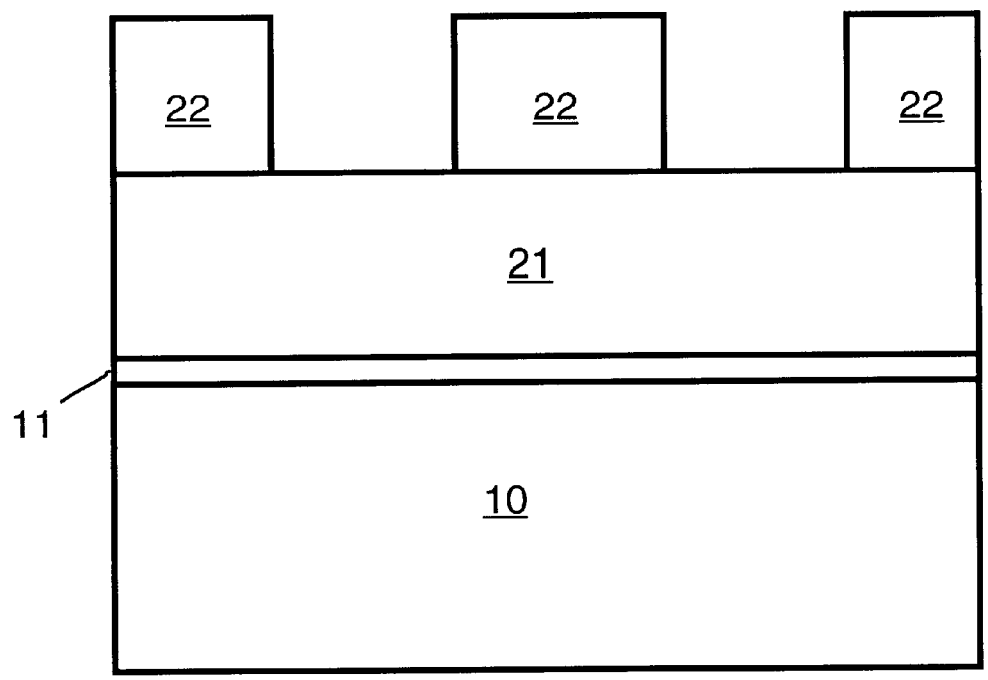

In a step 102, illustrated by FIG. 3, a layer of silicon nitride ($Si_3N_4$) 21 is formed on top of layer of buffer oxide 11. For example, layer of silicon nitride 21 is formed by low pressure chemical vapor deposition (LPCVD, $SiH_2Cl_2$+ $NH_3$• Dichlorosilane/Ammonia). The layer of silicon nitride 21 is, for example, approximately 200 nm thick. In a step 103, also illustrated by FIG. 3, a photoresist pattern 22 is formed on silicon nitride layer 21 using photolithography.

Figure 4:
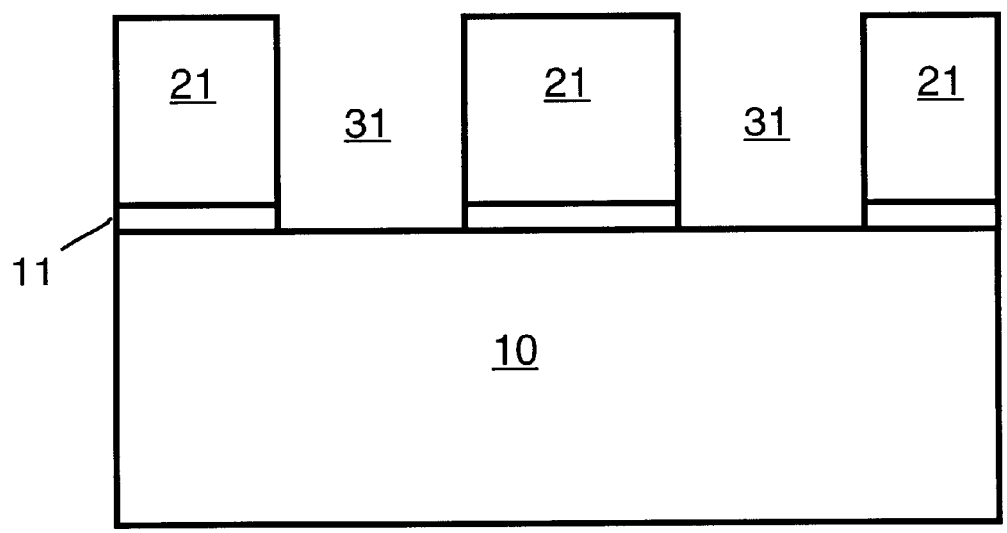

In a step 104, illustrated by FIG. 4, a dry etch process is used to etch through nitride layer 21 and buffer oxide 11 to substrate 10. Etched areas 31 indicate locations in which trenches will be formed.

Figure 5:
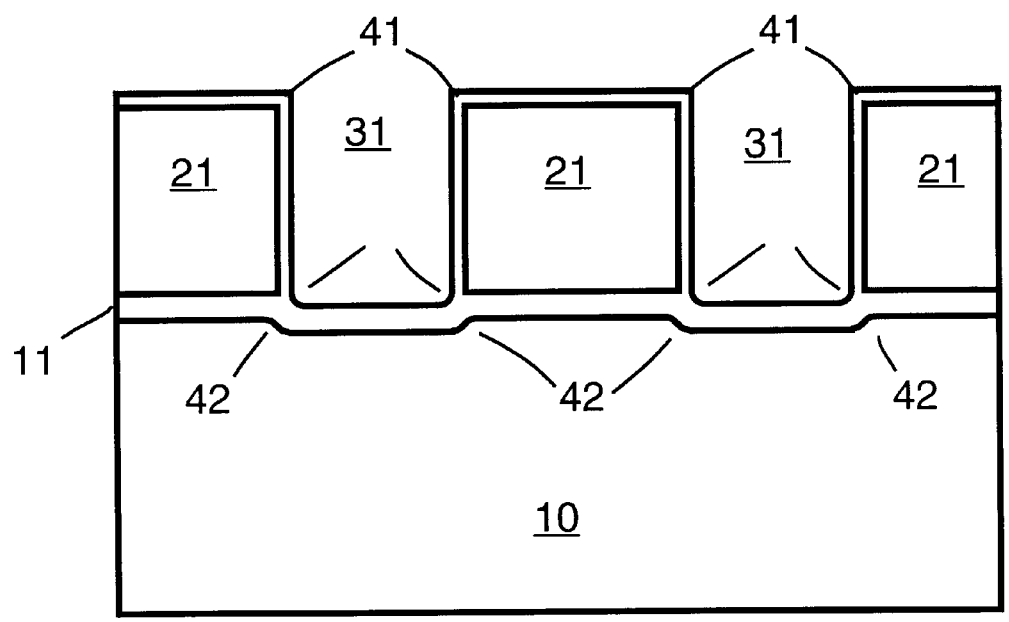

In a step 105, illustrated by FIG. 5, a thermal oxidation is performed to provide for rounded corners 42 of the substrate at the edges of the (to be formed) trenches. The thermal oxidation also results in an oxide layer 41 being formed over the exposed areas of silicon. Oxide layer 41 has a thickness of approximately 2 nm to 30 nm. The thickness is chosen for a particular process so that in resulting circuitry, a parasitic transistor at corners 42 has a higher threshold voltage, and gate oxide at corners 42 is thick enough to overcome immediate device failure and reliability issues.

The degree of rounding for corners 42 can also be varied by changing how much the remaining portions of buffer oxide 11 are recessed under the remaining portions of silicon nitride layer 21, and by varying the amount of undercutting of buffer oxide 11 under silicon nitride layer 21.

Figure 6:
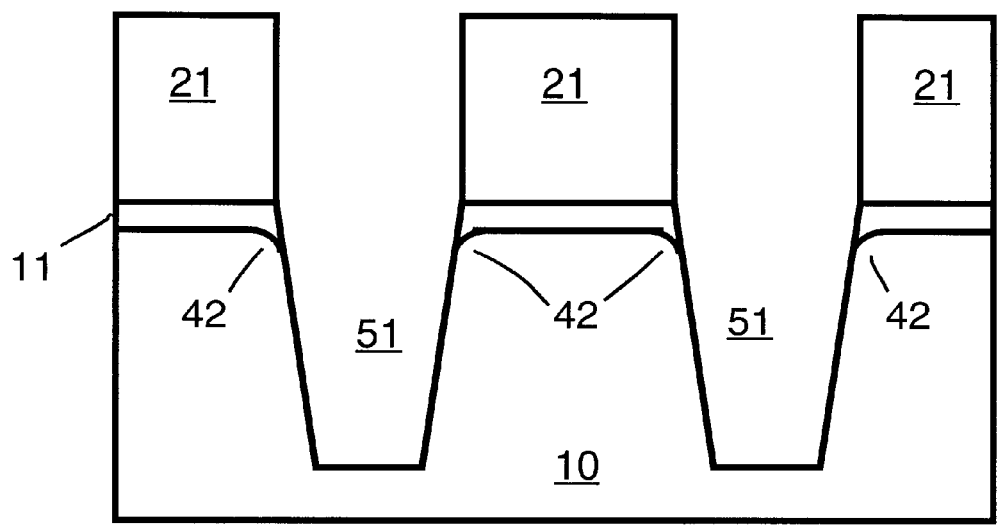

In a step 106, illustrated by FIG. 6, trenches 51 are formed by, for example, performing a dry etch of the silicon wafer. The dry etch can be one or more steps to etch the silicon and smooth out the sidewall profile. For example, trenches 51 are 0.4 microns wide and extend approximately 3000 Angstroms microns below the surface of substrate 10.

Figure 7:
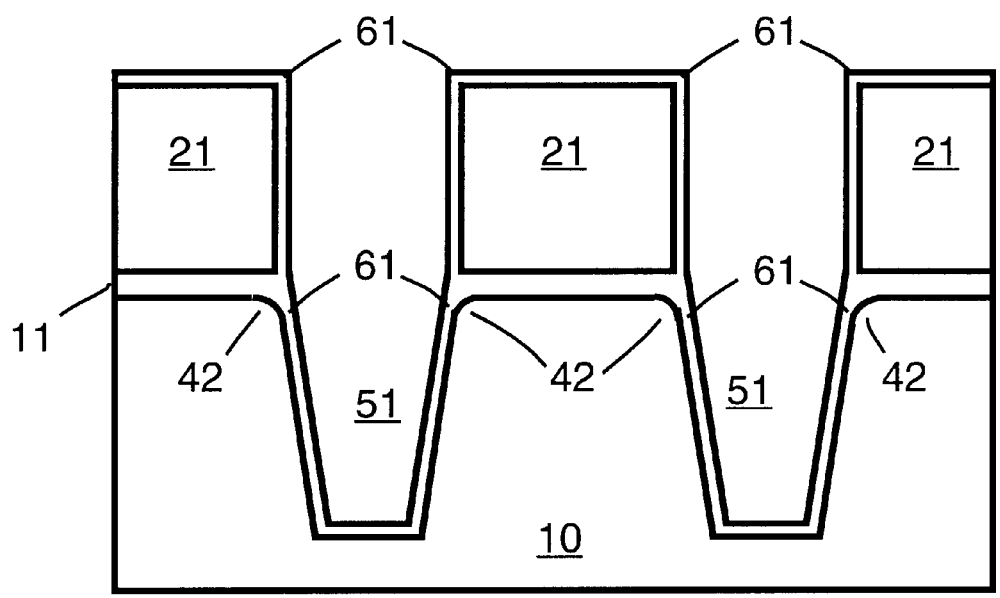

In a step 107, illustrated by FIG. 7, a layer of liner oxide 61 is thermally grown to anneal out any damage to the sidewalls of trenches 51 and to passivate the silicon on the sidewalls. For example, the layer of liner oxide is 100 Angstroms thick.

Figure 8:
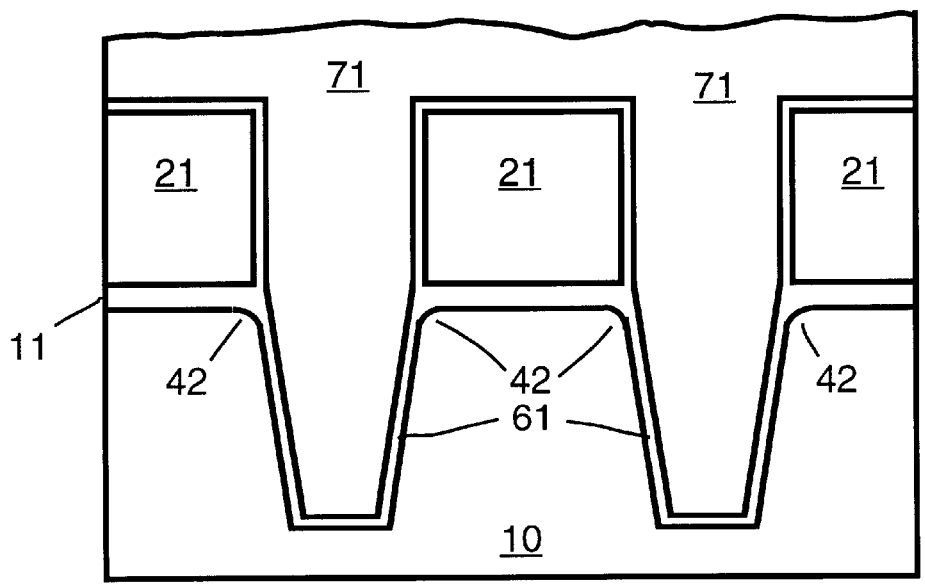

In a step 108, illustrated by FIG. 8, trenches 51 are filled by chemical vapor deposition (CVD) with a fill oxide 71 to a height considerably thicker than the trench depth. For example, the CVD oxide layer is deposited with a thickness of 7200 Angstroms.

Figure 9:
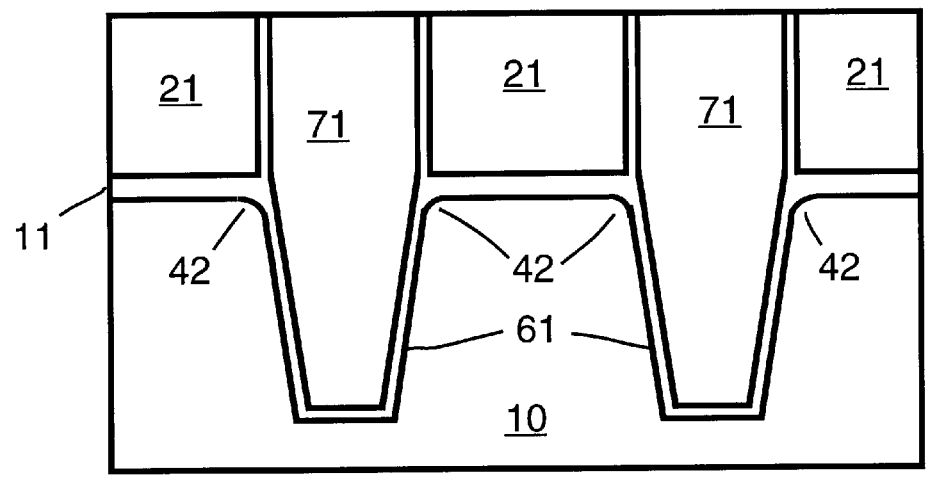

In a step 109. illustrated by FIG. 9, a chemical mechanical polish (CMP) process is performed to polish fill oxide 71 until the height of fill oxide 71 is at the level of the remaining portions of silicon nitride layer 21.

Figure 10:
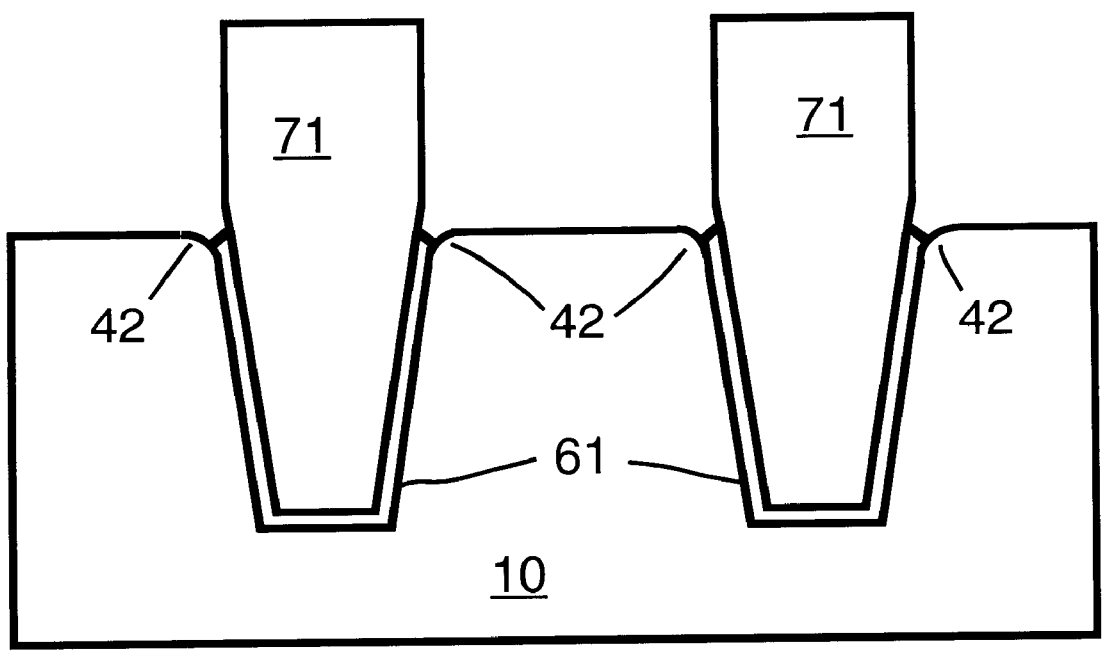

In a step 110, illustrated by FIG. 10, the remaining portions of silicon nitride layer 12 and the remaining portions of buffer oxide 11 are stripped away, for example, by a wet etch using a "hot" phosphoric acid solution. This results in shallow trench isolation.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for forming an isolation structure on an integrated circuit comprising the following steps:
   (a) on a substrate, forming a layer of buffer oxide;
   (b) forming a layer of nitride on the layer of buffer oxide;
   (c) patterning the layer of nitride and the layer of buffer oxide to form a trench area;
   (d) performing an oxidation of exposed areas of the substrate to provide for round corners at a perimeter of the trench area; and,
   (e) etching the substrate to form a trench within the trench area, remaining portions of the layer of nitride being used as a mask to define boundaries of the trench, wherein step (e) is performed after step (d).

2. A method as in claim 1 additionally comprising the following steps:
   (f) growing a layer of liner oxide within the trench;
   (g) filling the trench with oxide;
   (h) performing a chemical-mechanical polish of the oxide down to the nitride layer; and,
   (i) removing the nitride layer.

3. A method for forming an isolation structure on an integrated circuit using shallow trench isolation comprising the following steps:
   (a) forming a nitride mask to define a trench area on a substrate of the integrated circuit;
   (b) performing an oxidation of the substrate to provide for round corners at a perimeter of the trench area; and,
   (c) etching the substrate to form a trench within the trench area, the nitride mask being used to define boundaries of the trench, wherein step (c) is performed after step (b).

4. A method as in claim 3 additionally comprising the following steps:
   (d) growing a layer of liner oxide within the trench;
   (e) filling the trench with oxide;
   (f) performing a chemical-mechanical polish of the oxide down to the nitride mask; and,
   (g) removing the nitride mask.

5. A method for forming an isolation structure on an integrated circuit using shallow trench isolation comprising the following steps:
   (a) forming a nitride mask to define a trench area on a substrate of the integrated circuit;
   (b) rounding the substrate at a perimeter of the trench area; and,
   (c) etching the substrate to form a trench within the trench area, the nitride mask being used to define boundaries of the trench, wherein step (c) is performed after step (b).

6. A method as in claim 5 additionally comprising the following steps:
   (d) growing a layer of liner oxide within the trench;
   (e) filling the trench with oxide;
   (f) performing a chemical-mechanical polish of the oxide down to the nitride mask; and,
   (g) removing the nitride mask.

* * * * *